US010217781B2

(12) United States Patent
Ionescu et al.

(10) Patent No.: US 10,217,781 B2
(45) Date of Patent: Feb. 26, 2019

(54) ONE TRANSISTOR ACTIVE PIXEL SENSOR WITH TUNNEL FET

(71) Applicant: ECOLE POLYTECHNIQUE FEDERALE DE LAUSANNE (EPFL), Lausanne (CH)

(72) Inventors: Mihai Adrian Ionescu, Ecublens (CH); Nilay Dagtekin, Lausanne (CH)

(73) Assignee: ECOLE POLYTECHNIQUE FEDERALE DE LAUSANNE (EPFL), Lausanne (CH)

( * ) Notice: Subject to any disclaimer, the term of this patent is extended or adjusted under 35 U.S.C. 154(b) by 0 days.

(21) Appl. No.: 15/633,803

(22) Filed: Jun. 27, 2017

(65) Prior Publication Data
US 2017/0345858 A1 Nov. 30, 2017

Related U.S. Application Data

(62) Division of application No. 15/079,976, filed on Mar. 24, 2016, now Pat. No. 9,721,982.

(60) Provisional application No. 62/139,095, filed on Mar. 27, 2015.

(51) Int. Cl.
| | | |
|---|---|---|
| *H01L 29/88* | (2006.01) | |
| *H01L 29/78* | (2006.01) | |
| *H01L 27/146* | (2006.01) | |
| *H01L 29/739* | (2006.01) | |

(52) U.S. Cl.
CPC .. *H01L 27/14616* (2013.01); *H01L 27/14649* (2013.01); *H01L 29/7391* (2013.01); *H01L 29/7831* (2013.01)

(58) Field of Classification Search
CPC .......................... H01L 29/7311; H01L 29/0895
See application file for complete search history.

(56) References Cited

U.S. PATENT DOCUMENTS

| | | | |
|---|---|---|---|
| 2006/0113612 A1* | 6/2006 | Gopalakrishnan | .... H01L 27/105 257/392 |
| 2015/0171167 A1 | 6/2015 | Nourbakhsh et al. | |
| 2016/0268401 A1* | 9/2016 | Aleksov | .............. H01L 29/7869 |

OTHER PUBLICATIONS

Biswas, Arnab, and Adrian M. Ionescu. "1T Capacitor-less DRAM cell based on asymmetric Tunnel FET design." Electron Devices Society, IEEE Journal of the 3.3 (2015): 217-222.
(Continued)

*Primary Examiner* — Steven Loke
*Assistant Examiner* — Scott Stowe
(74) *Attorney, Agent, or Firm* — Andre Roland S.A.; Nikolaus Schibli

(57) ABSTRACT

A tunneling field effect transistor for light detection, including a p-type region connected to a source terminal, a n-type region connected to a drain terminal, an intrinsic region located between the p-type region and the n-type region to form a P-I junction or an N-I junction with the n-type region or the p-type region, respectively, a first insulating layer and a first gate electrode, the first gate electrode covering a portion of the intrinsic region on one side, and a second insulating layer and a second gate electrode, the second insulating layer and the second gate electrode covering an entire other side of the intrinsic region opposite to the one side, wherein an area of the intrinsic region that is not covered by the first gate electrode forms a non-gated intrinsic area configured for light absorption.

11 Claims, 11 Drawing Sheets

(56) References Cited

OTHER PUBLICATIONS

Biswas, Arnab, and Adrian M. Ionescu. "Study of Fin-Tunnel FETs with doped pocket as Capacitor-less 1T DRAM." SOI-3D-Subthreshold Microelectronics Technology Unified Conference (S3S), 2014 IEEE. IEEE, 2014.

Dagtekin, Nilay, and Adrian M. Ionescu. "Investigation of partially gated Si tunnel FETs for low power integrated optical sensing." Solid State Device Research Conference (ESSDERC), 2014 44th European. IEEE, 2014.

Dagtekin, Nilay, and Adrian M. Ionescu. "Partially gated lateral tunnel field effect transistor for optical applications." Applied Physics Letters 105.23 (2014): 232105.

Fossum, Eric R., and Donald B. Hondongwa. "A review of the pinned photodiode for CCD and CMOS image sensors." IEEE J. Electron Devices Soc 2.3 (2014): 33-43.

Huang, Qiyu, Lin Su, and Tongdan Jin. "Back-Side Illuminated Photogate CMOS Active Pixel Sensor Structure With Improved Short Wavelength Response." Sensors Journal, IEEE 11.9 (2011): 1993-1997.

Ionescu, Adrian M., and Heike Riel. "Tunnel field-effect transistors as energy-efficient electronic switches." Nature 479.7373 (2011): 329-337.

Jhou, Y. D., et al. "Nitride-based light emitting diode and photodetector dual function devices with InGaN/GaN multiple quantum well structures." Solid-state electronics 49.8 (2005): 1347-1351.

Mayer, F., et al. "Impact of SOI, Si 1-x Ge x OI and GeOI substrates on CMOS compatible tunnel FET performance." Electron Devices Meeting, 2008. IEDM 2008. IEEE International. IEEE, 2008.

Biswas, Arnab, et al. "Investigation of tunnel field-effect transistors as a capacitor-less memory cell." Applied Physics Letters 104.9 (2014): 092108.

Krishnamoorthy, Sriram, et al. "Polarization-engineered GaN/InGaN/GaN tunnel diodes." Applied Physics Letters 97.20 (2010): 203502.

\* cited by examiner

ONE TRANSISTOR ACTIVE PIXEL SENSOR WITH TUNNEL FET

CROSS-REFERENCE TO RELATED APPLICATIONS

The present application is a divisional application that claims priority to U.S. application Ser. No. 15/079,976 that was filed on Mar. 24, 2016, and also claims priority to the provisional application with the U.S. application Ser. No. 62/139,095 that was filed on Mar. 27, 2015, the entire contents of both these references being herewith incorporated by reference.

FIELD OF THE INVENTION

The present invention relates to the field of tunneling devices and solid state optical sensors, and a novel method of using a tunnel field effect transistor (TFET) for light sensing, for example image sensors.

DISCUSSION OF THE BACKGROUND ART

Currently, there are two main technologies that are used for image sensing and light detection in a camera: pixels based on the charge-coupled devices (CCD) and complementary metal-oxide semiconductor (CMOS) based active pixel sensors (APS). Both technologies transduce light into an electrical output signal in two steps: first converting the received amount of light into a corresponding number of electrons via photoelectric effect observed in semiconductors, and second, processing these photo-generated electrons in order to produce a measurable electrical signal. Each technology has different strengths and weaknesses, and they differentiate from each other mainly in the second step. CCDs are inherently charge-mode devices, whereas APS type sensors may use different methods to convert photo-generated carriers into an electrical signal.

In a CCD sensor, many signal processing functions are undertaken outside the sensor area, as CCD pixels and the signal electronics are made by different technologies, whereas a CMOS sensor incorporates the processing units such as analog-to-digital (AD) converters, sample-and-hold circuits, amplifiers, etc. on the same chip. Therefore, compared to CCD sensors, CMOS sensors are more integration friendly, thus power and cost effective. However, the proximity between the circuitry and the active area with the pixels where light absorption takes place in a CMOS sensor may induce noise related problems. CCD was the predominant technology which enabled diverse consumer applications since their inception in 1970s and offered better light sensitivity and less noise compared to CMOS sensor in the past. With the recent technological advancements, such as back side illumination (BSI) CMOS sensors caught up with CCD technology in terms of image quality and they rapidly took up the automotive and mobile applications.

FIG. 1 shows the state of the art array configuration of CMOS image sensor (CIS) technology. Each APS pixel requires three to four (3-4) transistors for cell selectivity in an array, reset and charge transfer functions and a photodiode as the light sensitive device. By using a shared buffer and row selection transistors among eight (8) pixels, the effective number of transistors per pixel is reduced down to a ratio 1.375. By doing so, higher fill factors are achieved.

However, despite all these advances in the field of light and photon detection, pixel and image sensors, there is still great need to improve the current CIS performance in terms of sensitivity, speed and the dynamic range at scaled technology nodes.

SUMMARY

According to one aspect of the present invention, a tunneling field effect transistor for light detection is provided. The tunneling field affect transistor preferably includes a p-type region connected to a source terminal, a n-type region connected to a drain terminal, and an intrinsic region located between the p-type region and the n-type region to form a P-I junction or an N-I junction with the n-type region or the p-type region, respectively. Moreover, the tunneling field effect transistor preferably further includes a first insulating layer and a first gate electrode, the first gate electrode covering a portion of the intrinsic region on one side, the first gate configured for applying a gate bias voltage for band-to-band tunneling, and a second insulating layer and a second gate electrode, the second insulating layer and the second gate electrode covering an entire other side of the intrinsic region opposite to the one side, the second gate electrode configured for generating a potential well in the intrinsic region, and an area of the intrinsic region that is not covered by the first gate electrode forms a non-gated intrinsic area configured for the light absorption.

According to another aspect of the present invention, a method for operating a tunnel field effect transistor for detecting light is provided. Preferably, the tunnel field effect transistor including a source p-type region connected to a source terminal, a drain n-type region connected to a drain terminal, an intrinsic region located between the p-type region and the n-type region to form a P-I junction or a N-I junction with the source n-type region or the drain p-type region, respectively, a first insulating layer and a first gate electrode, the first gate electrode covering a portion of the intrinsic region on one side, and a second insulating layer and a second gate electrode covering an entire other side of the intrinsic region opposite to the one side, an area of the intrinsic region that is not covered by the first gate electrode forming a non-gated intrinsic area for light absorption. In addition, preferably, the method includes the steps of biasing the second gate electrode to remove a potential well in the intrinsic region for removing charges from the intrinsic region, applying a voltage to the second gate electrode to form the potential well in the intrinsic region while simultaneously exposing the non-gated intrinsic area to light to accumulate a charge in the non-gated intrinsic area, and reading out the charge from the non-gated intrinsic area via the drain terminal by generating band-to-band tunneling with a voltage applied to the first gate electrode.

According to still another aspect of the present invention, an image sensor is provided. Preferably, the image sensor includes a plurality of pixels arranged in an array to form columns and rows of pixels, each pixel including a tunnel field effect transistor including a p-type region connected to a source terminal, a n-type region connected to a drain terminal, an intrinsic region located between the p-type region and the n-type region to form a P-I junction or a N-I junction with the n-type region or the p-type region, respectively, a first insulating layer and a first gate electrode, the first gate electrode covering a portion of the intrinsic region on one side, and a second insulating layer and a second gate electrode covering an entire other side of the intrinsic region opposite to the one side, an area of the intrinsic region that is not covered by the first gate electrode forming a non-gated intrinsic area for light absorption. Moreover, the image sensor preferably further includes a plurality of column busses, each column bus connecting to drain terminals of the tunnel field effect transistors of the columns of pixels, a plurality of select row busses, each select row bus connecting to first gate electrodes of the tunnel field effect transistors of the rows of pixels, and a plurality of reset row busses, each reset row bus connecting to second gate electrodes of the tunnel field effect transistors of the rows of pixels.

The above and other objects, features and advantages of the present invention and the manner of realizing them will become more apparent, and the invention itself will best be understood from a study of the following description with reference to the attached drawings showing some preferred embodiments of the invention.

A BRIEF DESCRIPTION OF THE SEVERAL VIEWS OF THE DRAWINGS

Figure 3A:
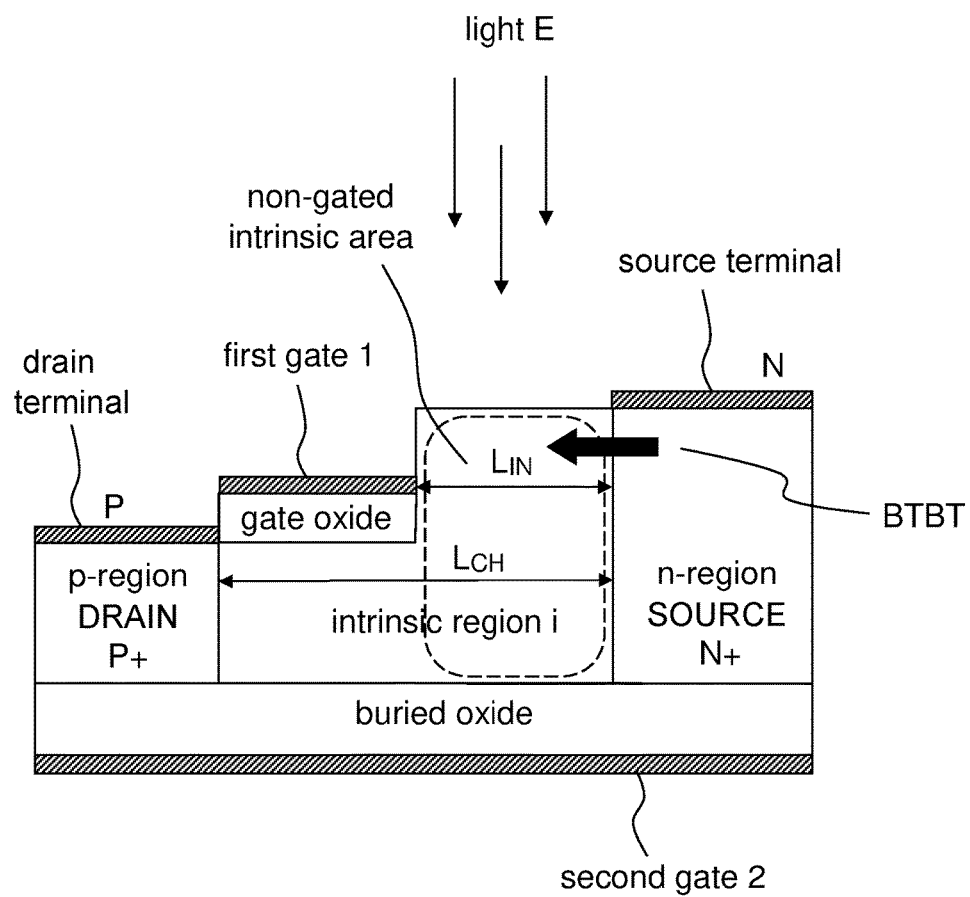
Figure 3B:
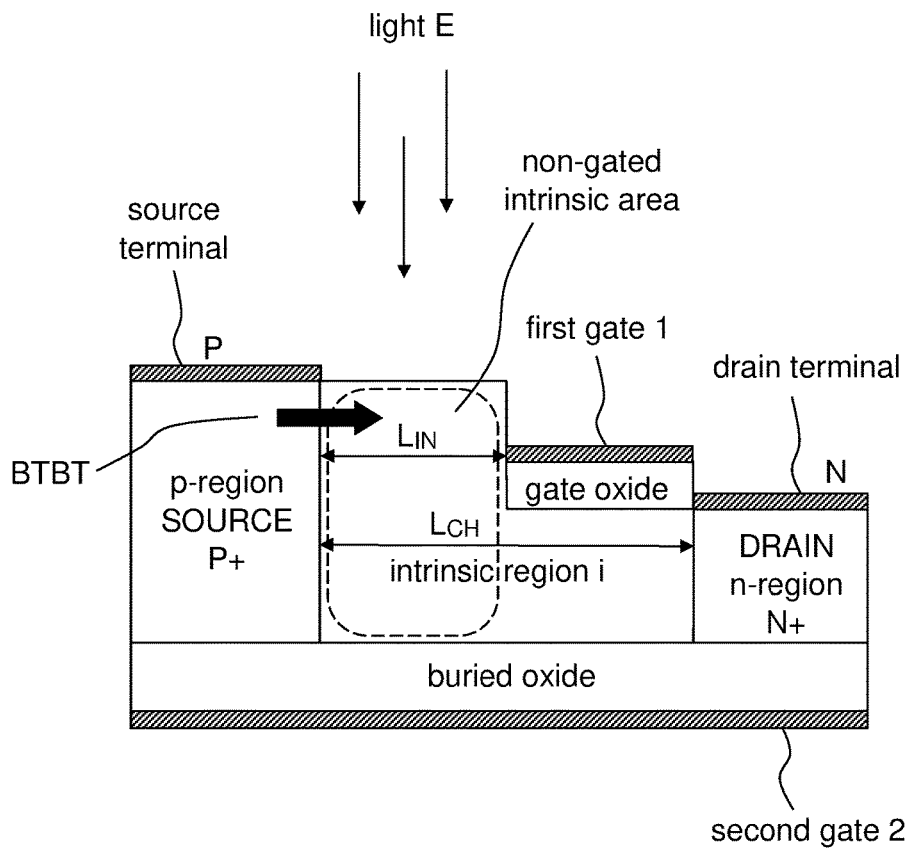
Figure 4:
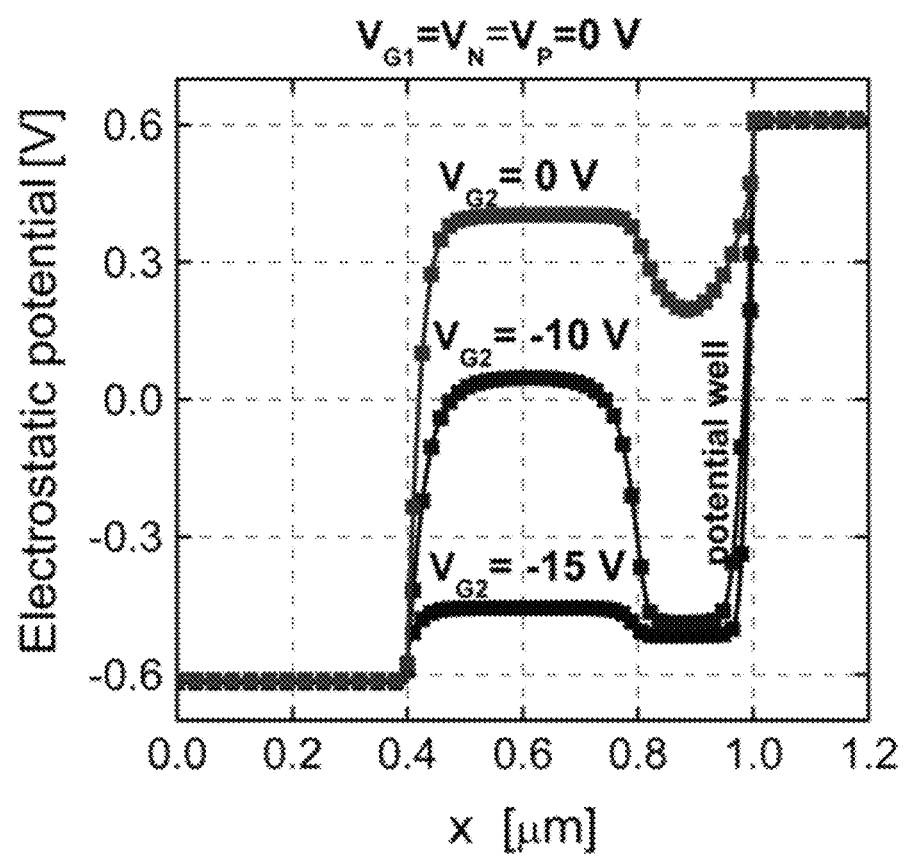
Figure 5:
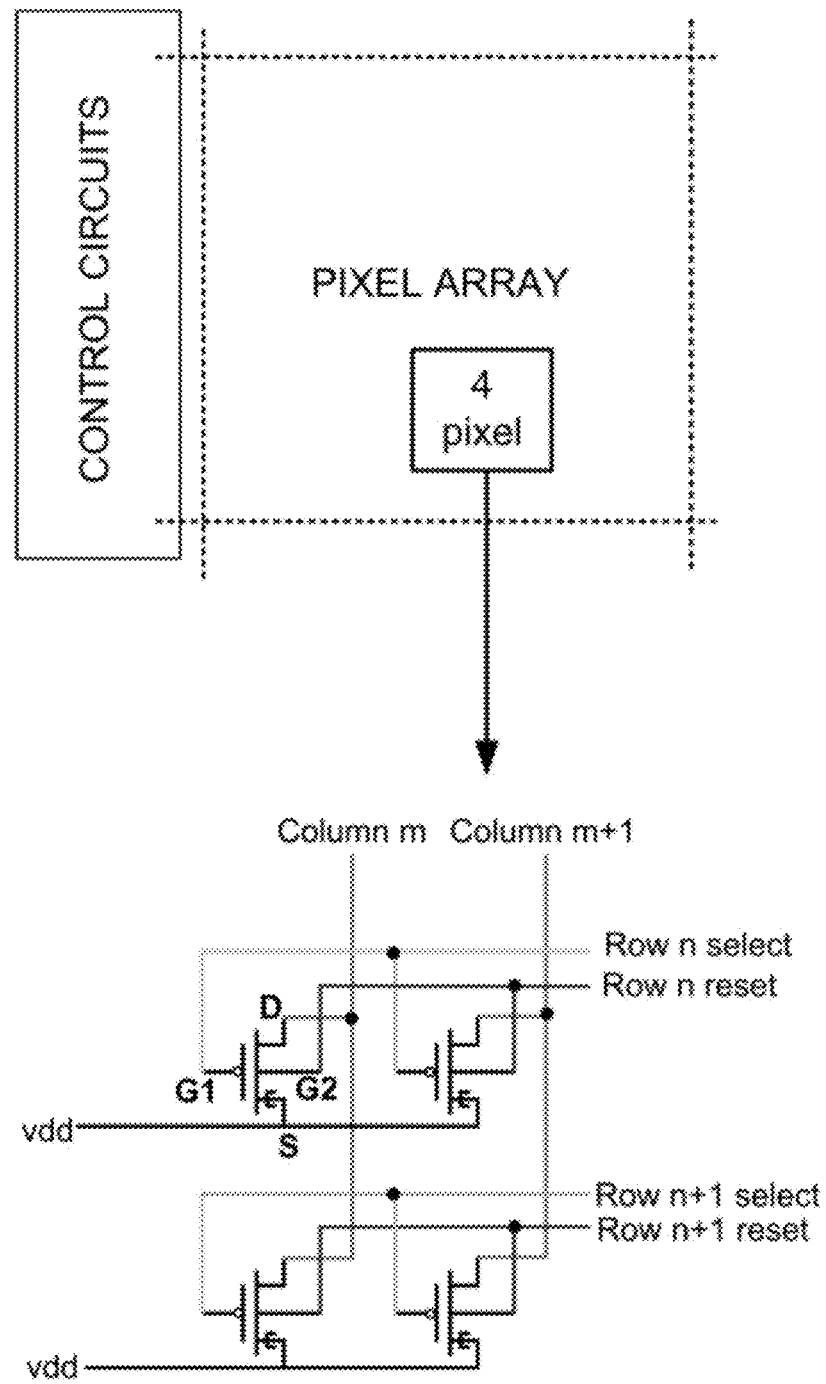
Figure 6:
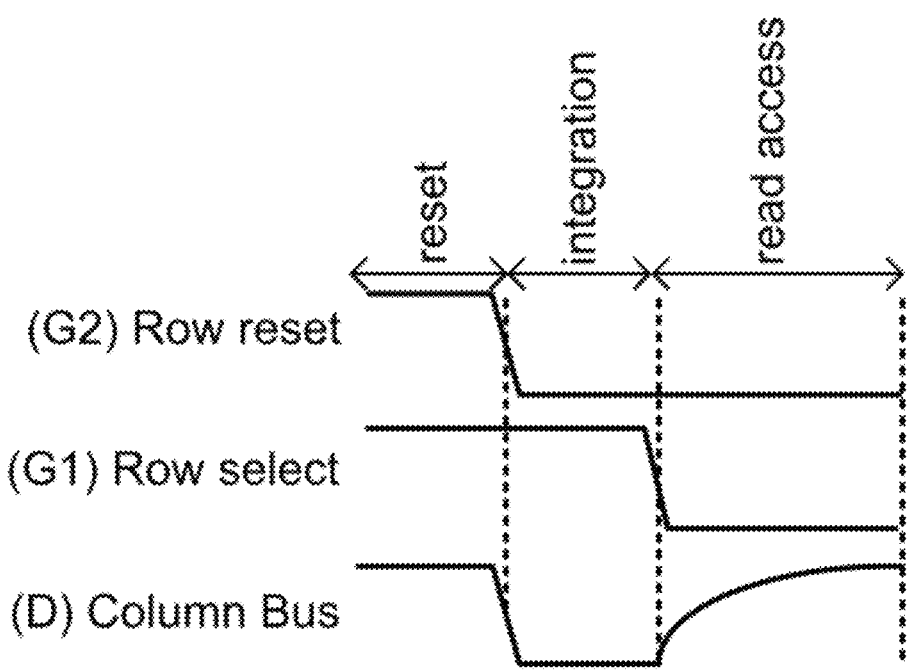
Figure 7:
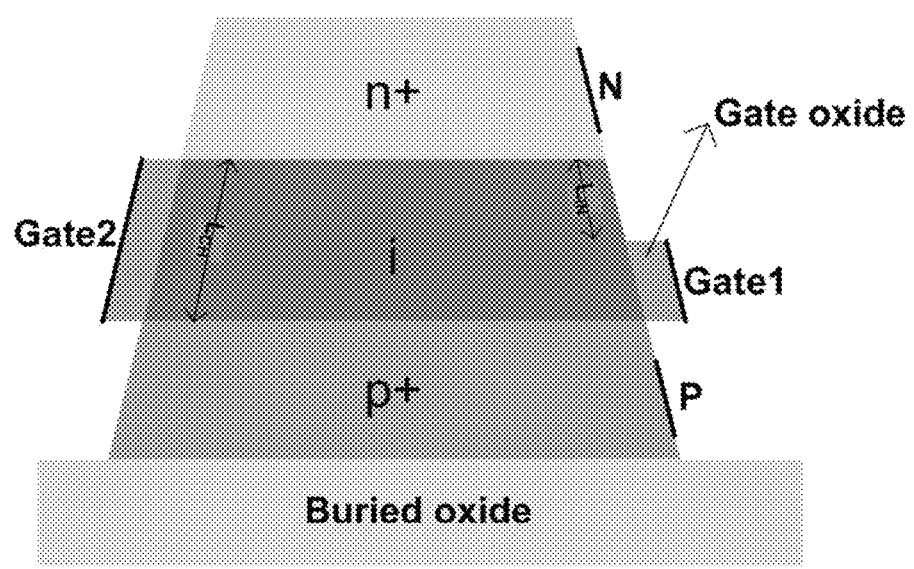
Figure 8:
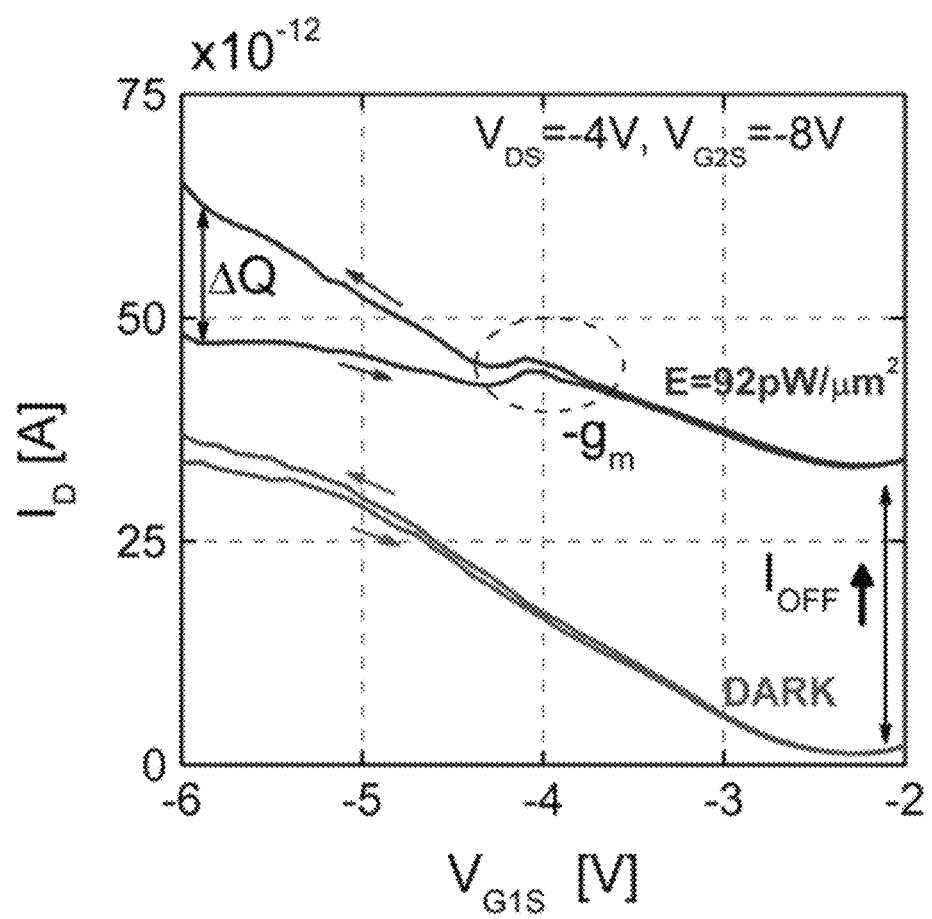
Figure 9:
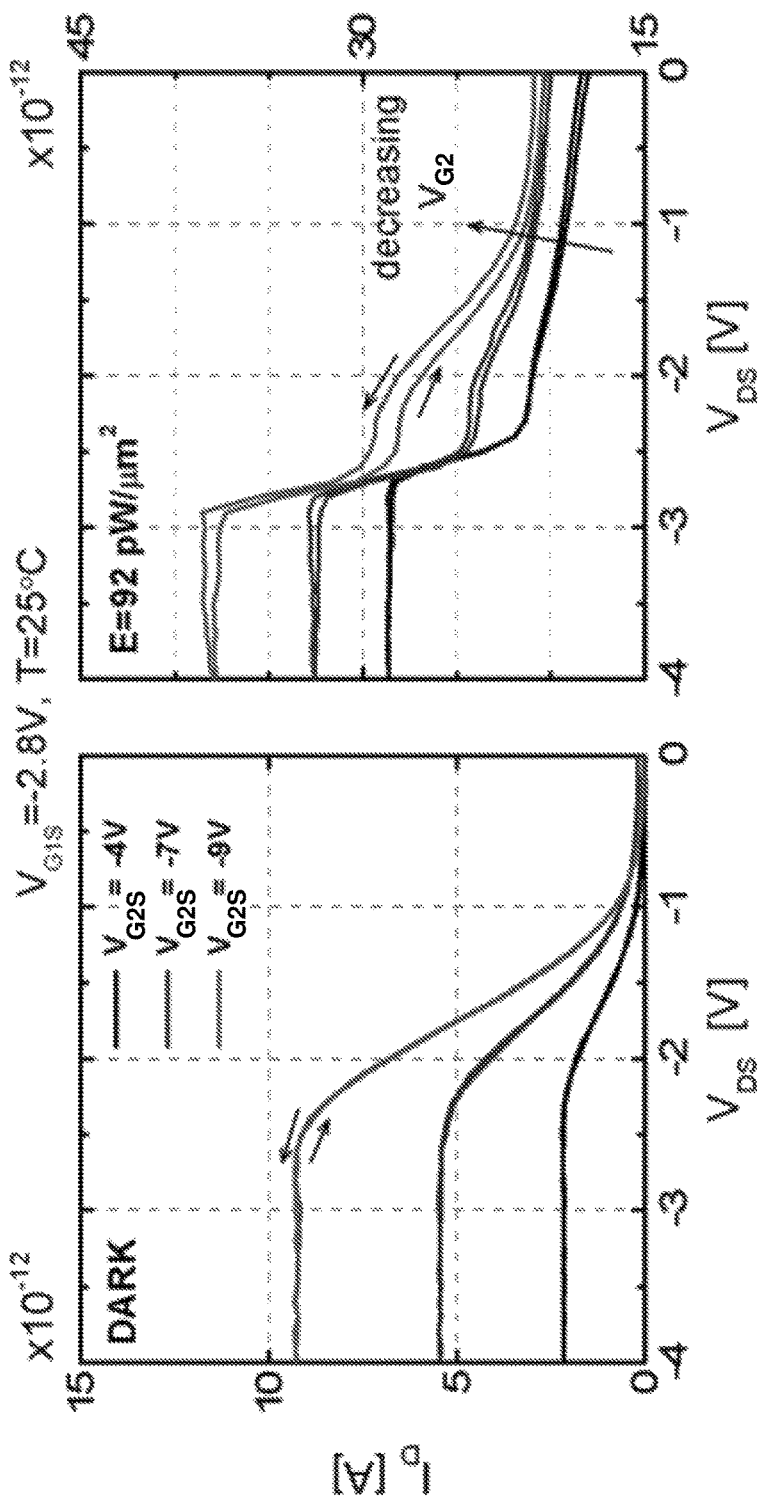
Figure 10:
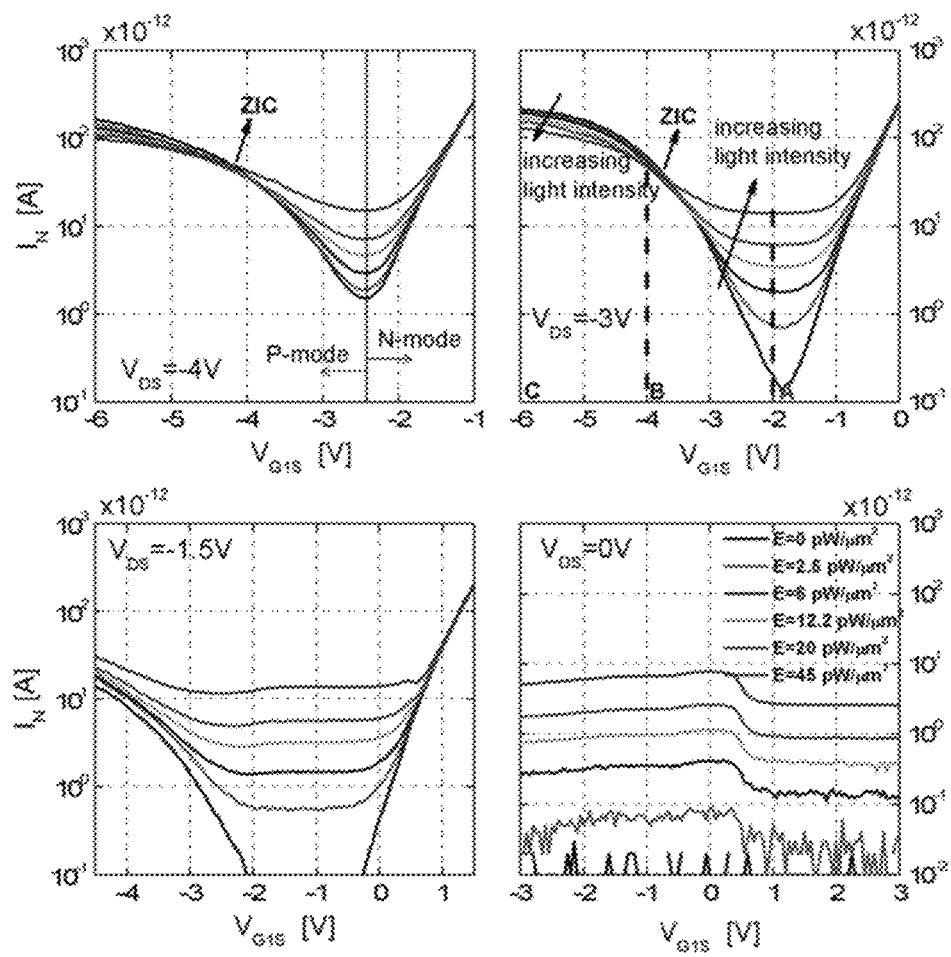

FIGS. 3A-3B show schematic cross-sectional views of another device according to an aspect of the present invention for sensing light with a tunnel FET by using a DG-TFET with a first gate partially overlapping the intrinsic region gate and a second gate fully covering the intrinsic region with a raised n+ doped region and a raised non-gated intrinsic region for P-mode operation (FIG. 3A) and with a raised p+ doped region and a raised non-gated intrinsic region for N-mode operation (FIG. 3B);

FIG. 4 shows graphs from simulation results showing the electrostatic potential profile along a cross section taken close to the buried oxide-channel interface when $V_{G1}=V_D=V_S=0V$. It can be seen that as voltage of the second gate 2 $V_{G2}$ becomes more negative as the potential well gets more pronounced;

FIG. 5 shows a schematic representation of a TFET based pixel sensor according to another aspect of the present invention, with four DG-TFET pixels arranged in a matrix and its array configuration;

FIG. 6 shows a qualitative timing diagram that can be used to reset, integrate and read-out information from the TFET based pixel sensor;

FIG. 7 shows a schematic cross-sectional view of a vertical tunnel DG-FET that has a potentially inclined structure for light sensing applications, according to still another aspect of the present invention;

FIG. 8 shows graphs from measured drain current $I_D$ versus gate-source voltage $V_{G1S}$ of first gate 1 in both a dark environment and under light, in P-mode. It can be seen that with optical excitation, $I_{OFF}$ increases, negative $g_m$ is introduced at the circled area and the charges accumulated in the body ($\Delta Q$) cause hysteresis. $W_G=10$ μm, $L_{CH}=1.24$ μm, $L_{IN}=0.5$ μm;

FIG. 9 shows graphs from measured drain current $I_D$ versus drain-source voltage $V_{DS}$ at various gate voltages $V_{G2}$ of second gate 2 in both a dark environment (left) and under light (right), to demonstrate the potential well. It can be seen that hysteresis becomes more pronounced as $V_{G2}$ decreases only under illumination. WG=10 μm, $L_{CH}=1.2$ μm, $L_{IN}=0.2$ μm; and FIG. 10 shows graphs of measured transfer characteristics of a TFET at $V_{G2D}=0V$, $V_{DS}=0V$, $-1.5V$, $-3V$, $-4V$ and at various illumination intensities demonstrating phototransistor behavior in P-mode operation, with <2 pW/μm² detection limit in TFET and PIN diode operation. $W_G=10$ μm, $L_{CH}=0.8$ μm, $L_{IN}=0.3$ μm. S and D refer to n+ and p+ regions, respectively.

Herein, identical reference numerals are used, where possible, to designate identical elements that are common to the figures. Also, the images in FIGS. 2-3, 5, and 7 are simplified for illustration purposes and may not be depicted to scale.

DETAILED DESCRIPTION OF THE SEVERAL EMBODIMENTS

Figure 1:
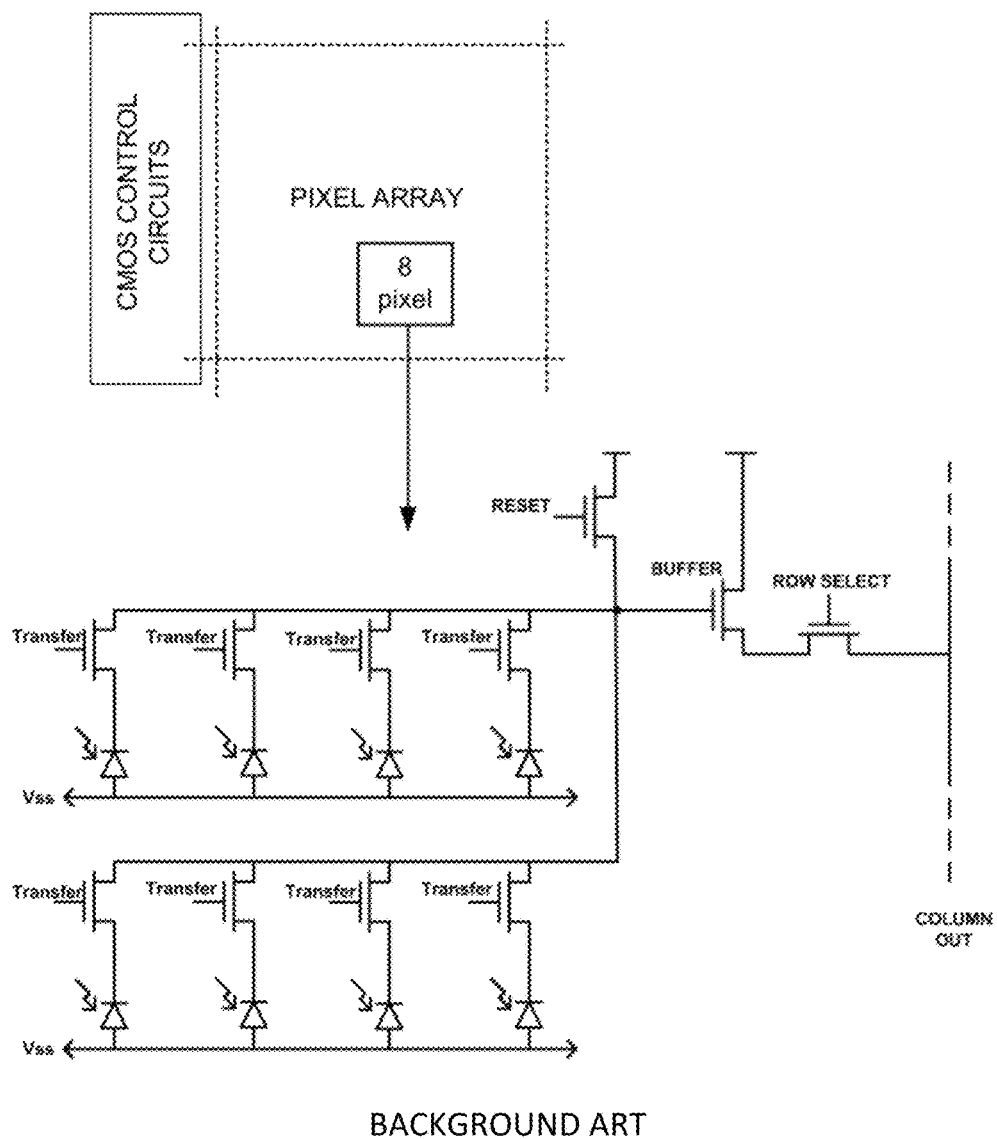
FIG. 1 shows a schematic representation of a background art CMOS imaging technology device with read-out transistors being shared among multiple pixels resulting in a ratio of 1.375 transistor/pixel.
Figure 2:
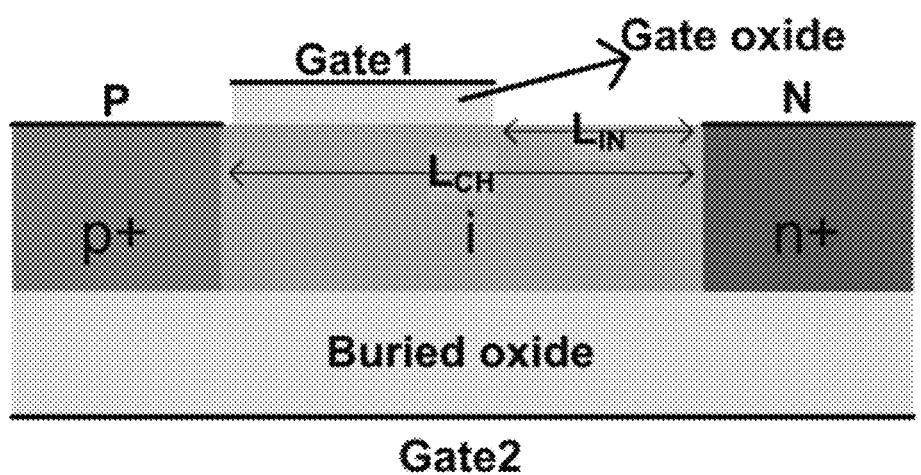
FIG. 2 shows a schematic cross-sectional view of a device according to one aspect of the present invention for sensing light with a tunnel FET by using a DG-TFET with one gate partially overlapping the intrinsic region to form a non-gated intrinsic area and another gate fully covering the intrinsic region.

FIG. 2 shows one aspect of the present invention, depicting a schematic cross-sectional view of a device for sensing light, made by a tunnel field effect transistor (FET) by using a double gate (DG) tunnel FET (TFET), including a source terminal P, a p-doped region P+, a n-doped drain N+, a drain terminal N, an intrinsic region or channel i located between the p-region and the n-region, and a first gate 1 partially overlapping the intrinsic region i arranged on top of the intrinsic region i and a first insulating layer as a gate oxide located between the intrinsic region and the first gate 1. Source terminal P can be a conductive layer such as a metal layer serving as an electrode deposited onto the p-region, and drain terminal N can be a conductive layer such as a metal layer serving as an electrode deposited onto the n-region. Moreover, the DG-TFET device further includes a second insulation layer as a buried oxide arranged below the p-region, the intrinsic region i, and n-region to cover the entire width of the DG-TFET device, and a second gate 2 fully covering an entire width of the intrinsic region i. In the variant shown, the second gate 2 covers the entire length of the buried oxide layer that forms a second insulating layer.

The area of the intrinsic region that is uncovered by the first gate 1, also referenced as the non-gated intrinsic area of the intrinsic region i has the length $L_{IN}$ along a longitudinal extension of the intrinsic region i, while a length of the intrinsic region i along the longitudinal extension is $L_{CH}$. The first gate 1 is arranged to cover the intrinsic region i partially, when viewing towards the intrinsic region i from a negative z direction, while the second gate 2 is arranged to cover the intrinsic region i entirely, when viewing towards the intrinsic region i from a positive z direction. The area of the intrinsic region i that is uncovered at the length $L_{IN}$, i.e. the non-gated intrinsic region in the DG-TFET device, is an active area for light absorption or photon absorption. Preferably, the non-gated intrinsic area is also not covered by any opaque or over photon absorbing or reflecting layers to achieve high quantum efficiency of the non-gated intrinsic region. However, in a variant, the non-gated intrinsic area can be covered by a light filtering layer that is permissible for certain light wavelengths as an optical filter.

Voltages applied to the first gate 1, source terminal P, and drain terminal N control the transistor operation of the DG-TFET and the tunneling probability at the source-intrinsic region junction as in a traditional TFET. The additional gate terminal that is located underneath the intrinsic region i, second gate 2, is used to induce a potential well in the intrinsic region I or channel of the TFET. This generated potential well is used to store the photo-generated charge carriers that are generated in the non-gated intrinsic area, the number of which is proportional to the amount of received light through the uncovered area at $L_{IN}$. When the TFET is turned on with the first gate 1, the charges stored in the potential well influences the drain current $I_D$. Finally, the drain current $I_D$ becomes dependent on the voltage potential of first gate 1 ($V_{G1}$), voltage potential of the second gate 2 ($V_{G2}$), voltage potential of n-type region and the drain terminal N ($V_D$), voltage potential of p-region and the source terminal P ($V_S$) and light intensity (E) of the light that impinges onto the non-gated intrinsic area $L_{IN}$. However, in a variant, charges that are generated from light in intrinsic region i can also be stored without a potential well.

FIGS. 3A and 3B show another aspect of the present invention, where in FIG. 3A the first gate 1 is partially overlapping and covering the intrinsic region i, and the second gate 2 fully covering intrinsic region i from a lower side, with an additional raised n-doped region N+ and source terminal N as compared to a height of the p-doped region P+, the drain terminal P, and the first gate 1, and also including a raised non-gated intrinsic area as a part of the intrinsic region i, having the same height as the n-region. The device configuration shown in FIG. 3A is used for P-mode band-to-band tunneling at the n-i junction. Analogously, FIG. 3B shows a variant with an additional raised p-doped region P+ and source terminal P as compared to a height of the n-doped region N+, the drain terminal N, and the first gate 1, and also including a raised non-gated intrinsic area as a part of the intrinsic region i, having the same height as the p-region. The device configuration shown in FIG. 3B is used for N-mode band-to-band tunneling at the p-i junction. The structures shown in FIGS. 3A and 3B allows to optimize the light sensing by raising the height of the un-gated intrinsic area $L_{IN}$, as the increased height of the area where the light is absorbed in the intrinsic area i resulting in a higher quantum efficiency and coverage of a larger wavelength range that can be detected.

By applying a low voltage potential to second gate 2, it is possible to induce a potential well along the intrinsic region i or channel, as shown in the embodiments of FIGS. 2, 3A, and 3B. The results are shown in FIG. 4, where technology computer aided design (TCAD) simulation results show the electrostatic potential profile along a cross-section taken close to the buried oxide/channel i interface of the structure shown in FIG. 3A, when $V_{G1}=V_D=V_S=0V$. As $V_{G2}$ becomes more negative, the potential well gets more pronounced.

Depending on the bias conditions, band-to-band tunneling (BTBT) occurs at p-i or n-i junction giving rise to both N-mode and P-mode TFET operation, respectively, with the same DG-TFET structure. In a preferred embodiment, the focus is put on the P-mode operation, as shown in FIG. 3A, which increases the probability of any interaction between BTBT and photon absorption, as both processes takes place at the same junction where the non-gated intrinsic area is located, and the potential well is induced close to this junction.

FIG. 5 shows a possible photo-array device configuration built with the above P-type DG-TFETs described in FIGS. 2, 3A, and 3B. In a P-type DG-TFET, n-type region corresponds electrically to the source terminal p, meaning BTBT takes place at this junction. FIG. 6 shows the qualitative timing diagram of the control and output signals, that can be used as a method to operate the DG-TFET described above. With the device configuration shown in FIG. 5, the pixel reset, integration, and read-out sequences is given as follows. (1) In reset, to remove the charges from the body, second gate 2 is biased such that the potential well ceases to exist. $V_{G1}=V_D=V_S=V_{DD}$. (2) During charge integration, the voltage potential of the second gate 2 is reduced and biased at a potential such that potential well is formed. $V_{G1}=V_D=V_S=V_{DD}$. (3) In the read-out, the transistor is turned on by biasing first gate 1 such that BTBT is induced at the source-channel junction of the selected device. The column bus which is connected to the drain of the selected device is driven low. Then the column bus is released. The time constant of the column bus potential is determined by the drain current which is a function of the light intensity. $V_{G1}=0V$, $V_D=0V$, $V_S=V_{DD}$. $V_{G2}$ is kept at the bias condition at which the potential well is maintained.

FIG. 7 shows still another aspect of the present invention, showing an alternative structure for the DG-TFET to which the method described with the timing diagram of FIG. 6 can also be applied. The device represents a vertical TFET with two gates, a first gate 1 and a second gate 2 of different lengths, the first gate 1 having the length $L_{CH}$ and the second gate 2 having the length $L_{CH}-L_{IN}$, resulting in a potential well creation in the n+/i junction close to the channel—second gate 2 oxide interface. P-type region P+, source terminal P, n-type region N+, and drain terminal N are arranged, seen along the vertical direction, below and on top of the intrinsic region i. The advantage of this vertical TFET structure over the embodiments shown in FIGS. 2, 3A, and 3B is that the light absorption can be enhanced without reducing the tunneling current of the intrinsic region i which is affected by the length $L_{IN}$ simply by enlargement of the active area. In this embodiment, preferably a transparent n+ material is used for the n-type region N+, for example a layer having a band pass for the wavelength of interest, or sufficiently thin n+ layer in order to maximize the photon absorption in the intrinsic region i or channel, especially in the non-gated intrinsic area of region i where charge storage takes place. Analogously, if the direction of the illumination is in the negative z direction, the same considerations can apply to the p-type layer P+ and source terminal P. The non-gated intrinsic area can be used for creating unbalanced electrostatic control among the two gates, the first gage 1 and the second gage 2, which results in a potential well in the intrinsic region i, and the potential well can be used for charge storage.

In the context of FIGS. 2, 3A, 3B, 5 and 7, the use of the naming convention of drain and source for these DG-TFET devices provide an analogy with the operation of a traditional MOSFET transistor that is used in the CMOS technology, which usually has a gated n-i-n structure, as compared to the double-gated p-i-n structure of the TFET sensor devices. It is worth noting that by changing the N region into a P region and the P region into a N region, one can obtain a complementary device that will operate under the same principle but with voltages of opposite sign. Therefore, in a variant, complementary light sensors can be designed, in terms of the sign of applied voltages, using the same device principle discussed here.

An exemplary DG-TFET device that has been tested was fabricated by the Laboratoire d'électronique des technologies de l'information ("CEA-Leti") on a silicon-om-insulator (SOI) substrate with 145 nm BOX and 20 nm active Si layer using a mesa transistor process, with the structure shown in FIG. 3. The height-extended region of the intrinsic silicon $L_{IN}$ of the intrinsic region I on the n+ doped region is coated with $Si_3Ni_4$ which is a transparent material for the wavelength range of visible light. On the other hand, the gate stack which is composed of 6 nm $SiO_2$, 10 nm of TiN, and 50 nm of Poly Si, due to its metal and poly-Si composition, absorbs a large fraction of the optical power, preventing carrier generation along the intrinsic region under the first gate 1, along $L_{CH}$–$L_{IN}$.

The experimental test with the device shown in FIGS. 3A and 3B have provided that the optical response in N-mode the tunneling current and the photocurrent simply superpose and no modulation in the transistor gain is observed. However, in the P-mode, results are represented in the graphs shown in FIG. 8. A hysteresis can be observed in the transfer characteristics in the illuminated state resulting from optically-generated carriers being trapped in the potential well induced when $V_{G2S}$=–8V. For the proposed DG-TFET based imaging application, this property is used to store information corresponding to the light intensity, similarly to backside-illuminated photo-gates. Moreover, storage of optically-generated carriers in the non-gated intrinsic area can be shown by the output characteristics shown with the graphs of FIG. 9. It is observed that only under illumination, a hysteresis, which becomes more pronounced with decreasing $V_{G2}$, is observed, whereas in dark, no memory effect that is manifested by the hysteresis is seen. The reason is as $V_{G2}$ goes more negative, the potential well gets deeper and the charge capacity of the non-gated intrinsic area increases. In dark, although the potential well exists, no excess carriers are available because no photons are absorbed by the intrinsic region.

The transfer characteristics of a sample under various light intensities and various different drain-source voltages $V_{DS}$ are given in FIG. 10. Symmetrical shapes indicate that BTBT takes place at either or both p-i and n-i junctions depending on $V_{DS}$. The main observations that can be made from these transfer characteristics are: (1) Off-level current increases linearly with illumination E. (2) When the BTBT tunneling is established a relatively low drain current $I_D$ is elevated due to photocurrent. (3) In N-mode, as the tunneling rate increases, the effect of light absorption becomes imperceptible. (4) Whereas in P-mode, the drain current $I_D$ is observed to be not only depending on a voltage applied to the first gate 1 $V_{G1}$ but also depending on illumination E even at high tunneling rates, optical excitation causes the drain current $I_D$ to decrease giving rise to a phototransistor behavior with two regions: (4a) First, with positive illumination coefficient (IC=$\Delta I_D/\Delta E$), at the dashed line B shown in FIG. 10, as a conventional p-i-n junction; (4b) Second, with negative IC, at the lien C shown in FIG. 10, when operated as a TFET, with optically tunable gain; and (4c) Between these two regions, a unique bias point exists at which illuminance has no impact on $I_D$, called Zero Illumination Coefficient (ZIC), due to opposite dependences of leakage and tunneling on the charging of the potential well with optically generated carriers.

This unique property can be further exploited to enhance and tune the dynamic range of the above-described DG-TFET pixel. It is worth noting that in and the N-mode and in the P-mode the tunneling current reaches the same levels within the measured $V_{G1S}$ range. However, only in P-mode operation the storage of photo-generated carriers has an impact on the drain current $I_D$. As the devices used in experiments are silicon based, a light source with visible light spectrum has been used.

Moreover, the proposed transistor and the method of operating the transistor can be made as an active pixel sensor (APS) for different illumination types. For example, the device can be made as an (i) image sensor for the visible light wavelength, as described above, with DG-TFETs with a Silicon junction, as an (ii) image sensor for infrared (IR) and far-infrared light sensing, for example, with the use of DG-TFETs with Germanium, Silicon-Germanium (SiGe), and Germanium-Tin (GeSn) junctions, and as an (iii) image sensor for ultraviolet (UV) sensing, for example with DG-TFETs in Gallium Nitride (GaN/InGaN) junctions. Generally, the p-i-n structure of the DG-TFET can be either homojunction or heterojunction. It has been shown that heterojunction structures that are commonly used in photosensors enhance the tunneling process compared to the homojunction ones which is the natural choice for fabrication. For example, with GaN/InGaN junction embodiments for the DG-TFET for UV image sensors interesting characteristics are possible for heterojunction tunneling devices as well by enhancing the tunneling probability owing to the large electric field induced by the polarization and piezoelectric effect observed in Nitrides.

While the invention has been disclosed with reference to certain preferred embodiments, numerous modifications, alterations, and changes to the described embodiments, and equivalents thereof, are possible without departing from the sphere and scope of the invention. Accordingly, it is intended that the invention not be limited to the described embodiments, and be given the broadest reasonable interpretation in accordance with the language of the appended claims.

The invention claimed is:

1. A tunneling field effect transistor for light detection, comprising:
    a p-type region connected to a source terminal;
    a n-type region connected to a drain terminal;
    an intrinsic region located between the p-type region and the n-type region to form a P-I junction and an N-I junction with the p-type region and the n-type region, respectively;
    a first insulating layer and a first gate electrode, the first gate electrode covering a portion of the intrinsic region on one side, the first gate configured for applying a gate bias voltage for band-to-band tunneling; and
    a second insulating layer and a second gate electrode, the second insulating layer and the second gate electrode covering an entire other side of the intrinsic region opposite to the one side, the second gate electrode configured for generating a potential well in the intrinsic region,
    wherein an area of the intrinsic region that is not covered by the first gate electrode forms a non-gated intrinsic area configured for light absorption.

2. The tunnel field effect transistor according to claim 1, wherein a material used for the tunnel field effect transistor is one of Silicon for visible light detection, Germanium for infrared light detection, and Gallium Nitride for ultraviolet detection.

3. The tunnel field effect transistor according to claim 1, wherein the non-gated intrinsic area is in contact with the n-type region to be located at the N-I junction.

4. The tunnel field effect transistor according to claim 1, wherein the non-gated intrinsic area has a thickness that is thicker than the portion of the intrinsic region covered by the first gate electrode to form a raised non-gated intrinsic area.

5. The tunnel field effect transistor according to claim 4, wherein the n-type region has a same thickness as the raised non-gated intrinsic area.

6. An image sensor comprising:
    a plurality of pixels arranged in an array to form columns and rows of pixels, each pixel including,
    a tunnel field effect transistor including a p-type region connected to a source terminal, a n-type region connected to a drain terminal, an intrinsic region located between the p-type region and the n-type region to form a P-I junction and a N-I junction with the p-type region and the n-type region, respectively, a first insulating layer and a first gate electrode, the first gate electrode covering a portion of the intrinsic region on one side, and a second insulating layer and a second gate electrode covering an entire other side of the intrinsic region opposite to the one side, an area of the intrinsic region that is not covered by the first gate electrode forming a non-gated intrinsic area for light absorption;

a plurality of column busses, each column bus connecting to drain terminals of the tunnel field effect transistors of the columns of pixels;

a plurality of select row busses, each select row bus connecting to first gate electrodes of the tunnel field effect transistors of the rows of pixels; and a plurality of reset row busses, each reset row bus connecting to second gate electrodes of the tunnel field effect transistors of the rows of pixels.

7. The image sensor according to claim 6, further comprising:

a plurality of supply voltage busses, each supply voltage bus connecting to the source terminals of the tunnel filed effect transistors of the rows of pixels.

8. The image sensor according to claim 6, wherein a material used for the tunnel field effect transistor is one of Silicon for visible light detection, Germanium for infrared light detection, and Gallium Nitride for ultraviolet detection.

9. The image sensor according to claim 6, wherein the non-gated intrinsic area is in contact with the n-type region to be located at the N-I junction.

10. The image sensor according to claim 6, wherein the non-gated intrinsic area has a thickness that is thicker than the portion of the intrinsic region covered by the first gate electrode to form a raised non-gated intrinsic area.

11. The image sensor according to claim 10, wherein the n-type region has a same thickness as the raised non-gated intrinsic area.

* * * * *